US008701053B2

(12) United States Patent
Arai

(10) Patent No.: US 8,701,053 B2
(45) Date of Patent: Apr. 15, 2014

(54) DECISION METHOD, STORAGE MEDIUM AND INFORMATION PROCESSING APPARATUS

(71) Applicant: Canon Kabushiki Kaisha, Tokyo (JP)

(72) Inventor: Tadashi Arai, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/832,892

(22) Filed: Mar. 15, 2013

(65) Prior Publication Data

US 2013/0268902 A1  Oct. 10, 2013

(30) Foreign Application Priority Data

Apr. 6, 2012 (JP) ................................ 2012-087937

(51) Int. Cl.
*G06F 17/50* (2006.01)

(52) U.S. Cl.
USPC ............................................ 716/53; 716/54

(58) Field of Classification Search
USPC .................................................... 716/53, 54
See application file for complete search history.

(56) References Cited

U.S. PATENT DOCUMENTS

| 6,563,566 B2 | 5/2003 | Rosenbluth et al. |
| 7,001,712 B2* | 2/2006 | Imai et al. ..................... 430/313 |
| 2012/0096413 A1* | 4/2012 | Arai ................................ 716/53 |

FOREIGN PATENT DOCUMENTS

| JP | 2009-093138 A | 4/2009 |
| JP | 2009-094109 A | 4/2009 |

OTHER PUBLICATIONS

Nelder, et al.; "A simplex method for function minimization"; Computer Journal, vol. 7, p. 308-313, 1965.

* cited by examiner

*Primary Examiner* — Suresh Memula
(74) *Attorney, Agent, or Firm* — Rossi, Kimms & McDowell LLP

(57) ABSTRACT

The present invention provides a decision method which decides a mask pattern used in an exposure apparatus comprising a projection optical system that projects a mask pattern including a main pattern and an auxiliary pattern onto a substrate, and an exposure condition in the exposure apparatus, the method including a step of calculating an image of a mask pattern formed on the substrate by the projection optical system while changing settings of the mask pattern and the exposure condition, and deciding the mask pattern and the exposure condition based on the image of the mask pattern, wherein the step includes determining whether or not to generate a new auxiliary pattern after the settings are changed.

7 Claims, 9 Drawing Sheets

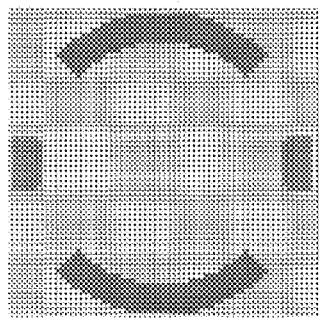
FIG. 5A
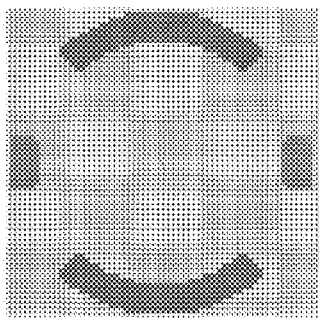
FIG. 5B
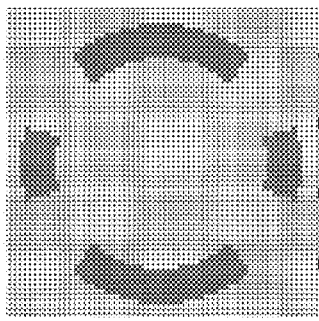
FIG. 5C
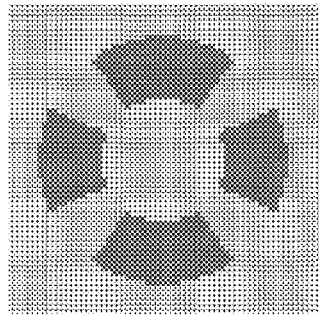
FIG. 5D
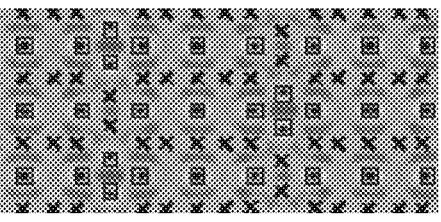
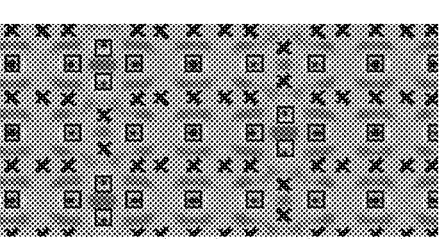
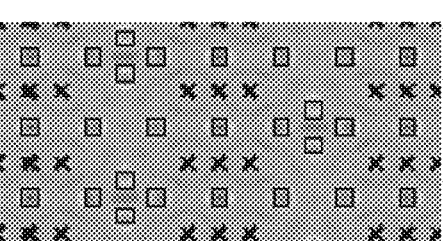
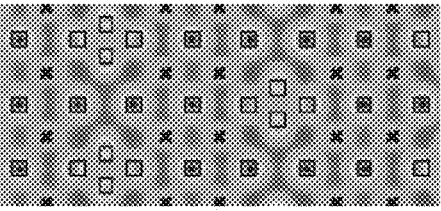
□ : MAIN PATTERN
× : AUXILIARY PATTERN

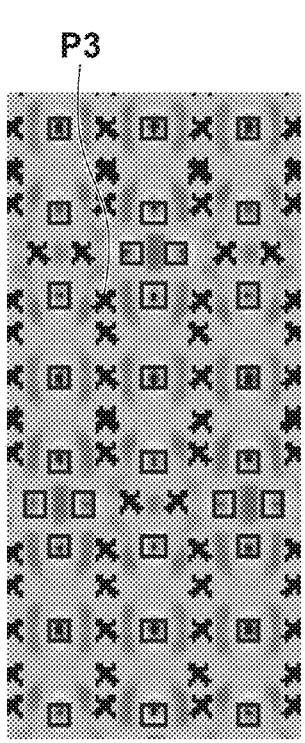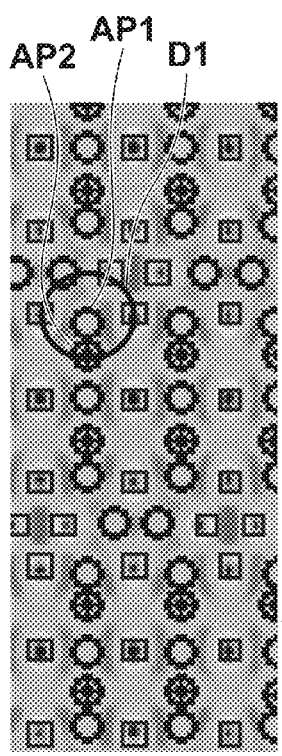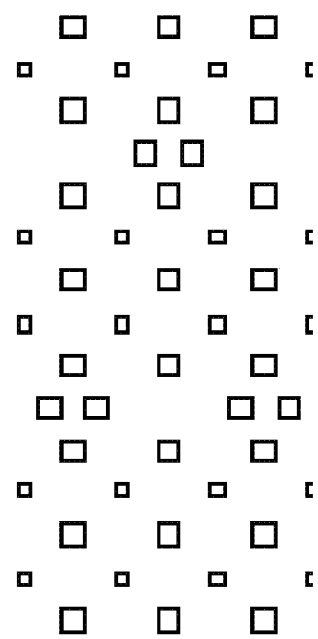
F I G. 10A    F I G. 10B    F I G. 10C

DECISION METHOD, STORAGE MEDIUM AND INFORMATION PROCESSING APPARATUS

BACKGROUND OF THE INVENTION

1. Field of the Invention

The present invention relates to a decision method for deciding a mask pattern and exposure conditions used in an exposure apparatus, a storage medium, and an information processing apparatus.

2. Description of the Related Art

In recent years, miniaturization of semiconductor devices has progressed, and it is difficult to transfer (resolve) a pattern by an exposure apparatus. Hence, in order to cope with miniaturization of semiconductor devices, an exposure apparatus adopts a super-resolution technique such as off-axis illumination or OPC (Optical Proximity Correction) so as to optimize an illumination shape (effective light source distribution) upon illuminating a mask pattern and mask. The illumination shape is a light intensity distribution formed on a pupil plane of an illumination optical system, and is also an angle distribution of light which illuminates a mask.

To optimize the illumination shape, a layout pattern (target pattern) of a device, evaluation positions of a transfer pattern (optical image), and evaluation items (size, DOF, exposure margin, and the like) at the evaluation positions are set. Next, a transfer pattern is calculated while changing the illumination shape, and values of evaluation items (evaluation values) at the evaluation positions of the transfer pattern are calculated. Then, calculations of the transfer pattern and evaluation values are repeated until the evaluation values satisfy an allowable range or the number of times of change of the illumination shape reaches a predetermined count. The illumination shape is numerically expressed. For example, in case of annular illumination having a given intensity, the illumination shape is expressed by a function having inner $\sigma$ and outer $\sigma$ as parameters (variables), and these parameters are optimized using a Monte Carlo method or the like. Even when a mask pattern remains the same, if a different illumination shape is used, a different transfer pattern is formed. For this reason, by changing the illumination pattern, a transfer pattern deviates from a target pattern. Hence, the OPC is required to match the transfer pattern with the target pattern. The OPC is executed every time the illumination shape is changed or when the illumination shape is changed by a given amount. However, the OPC is limited to correction of a shape of a transfer pattern such as a line width, edge shift, and image shift, and cannot apply correction of an image contrast, depth of focus, and the like, which are decided by the illumination shape and are associated with resolving performance.

U.S. Pat. No. 6,563,566 has proposed a technique for setting a pattern to be formed on a substrate (wafer), and calculating an optimized mask pattern and illumination shape by a mathematical approach. The technique of U.S. Pat. No. 6,563,566 analytically calculates solutions (mask pattern and illumination shape) in place of iterative calculations. In the technique of U.S. Pat. No. 6,563,566, the OPC is not applied, but a pattern to be formed on a substrate and an optimized mask pattern are different, and this technique is an optimization technique of the illumination pattern including correction of the mask pattern in the broad sense.

Also, Japanese Patent Laid-Open Nos. 2009-93138 and 2009-94109 have proposed a technique for inserting an auxiliary pattern (a self non-resolving pattern) into a main pattern (a self resolving pattern) so as to relax resolving performance differences between miniaturized density patterns and isolated patterns. In Japanese Patent Laid-Open Nos. 2009-93138 and 2009-94109, the auxiliary pattern is inserted at a peak (Laplacian peak) position of a two-dimensional TCC approximate aerial image.

However, the technique of U.S. Pat. No. 6,563,566 has the advantage that solutions can be analytically calculated, but it has to limit an evaluation item to a tilt of an optical image, and also has to limit a type of pattern to be formed on a substrate to one. In this manner, the technique of U.S. Pat. No. 6,563,566 is not practical since it has the disadvantage of low degrees of freedom.

In the technique of Japanese Patent Laid-Open Nos. 2009-93138 and 2009-94109, generation conditions required to generate an auxiliary pattern, that is, how to insert an auxiliary pattern with respect to a given illumination shape are fixed in advance. Therefore, the technique of Japanese Patent Laid-Open Nos. 2009-93138 and 2009-94109 does not always decide optimal illumination conditions and mask pattern.

SUMMARY OF THE INVENTION

The present invention provides a technique advantageous to decide a mask pattern including an auxiliary pattern and exposure conditions used in an exposure apparatus.

According to one aspect of the present invention, there is provided a decision method which decides a mask pattern used in an exposure apparatus comprising a projection optical system that projects a mask pattern including a main pattern and an auxiliary pattern onto a substrate, and an exposure condition in the exposure apparatus, the method including a step of calculating an image of a mask pattern formed on the substrate by the projection optical system while changing settings of the mask pattern and the exposure condition, and deciding the mask pattern and the exposure condition based on the image of the mask pattern, wherein the step comprises determining whether or not to generate a new auxiliary pattern after the settings are changed, generating the new auxiliary pattern according to a generation condition of the auxiliary pattern when it is determined that the new auxiliary pattern is generated, and calculating the image of the mask pattern using the mask pattern including the generated auxiliary pattern and the main pattern after the settings are changed, and the exposure condition after the settings are changed, and calculating, when it is determined that the new auxiliary pattern is not generated, the image of the mask pattern using a mask pattern including an auxiliary pattern generated before the settings are changed and the main pattern after the settings are changed, and the exposure condition after the settings are changed.

Further aspects of the present invention will become apparent from the following description of exemplary embodiments with reference to the attached drawings.

BRIEF DESCRIPTION OF THE DRAWINGS

FIGS. 5A to 5D are views showing effective light sources and mask patterns, which are sequentially changed (set) by the decision method of this embodiment.

FIGS. 10A to 10C are views for explaining a proximity pattern distance.

DESCRIPTION OF THE EMBODIMENTS

Figure 1:
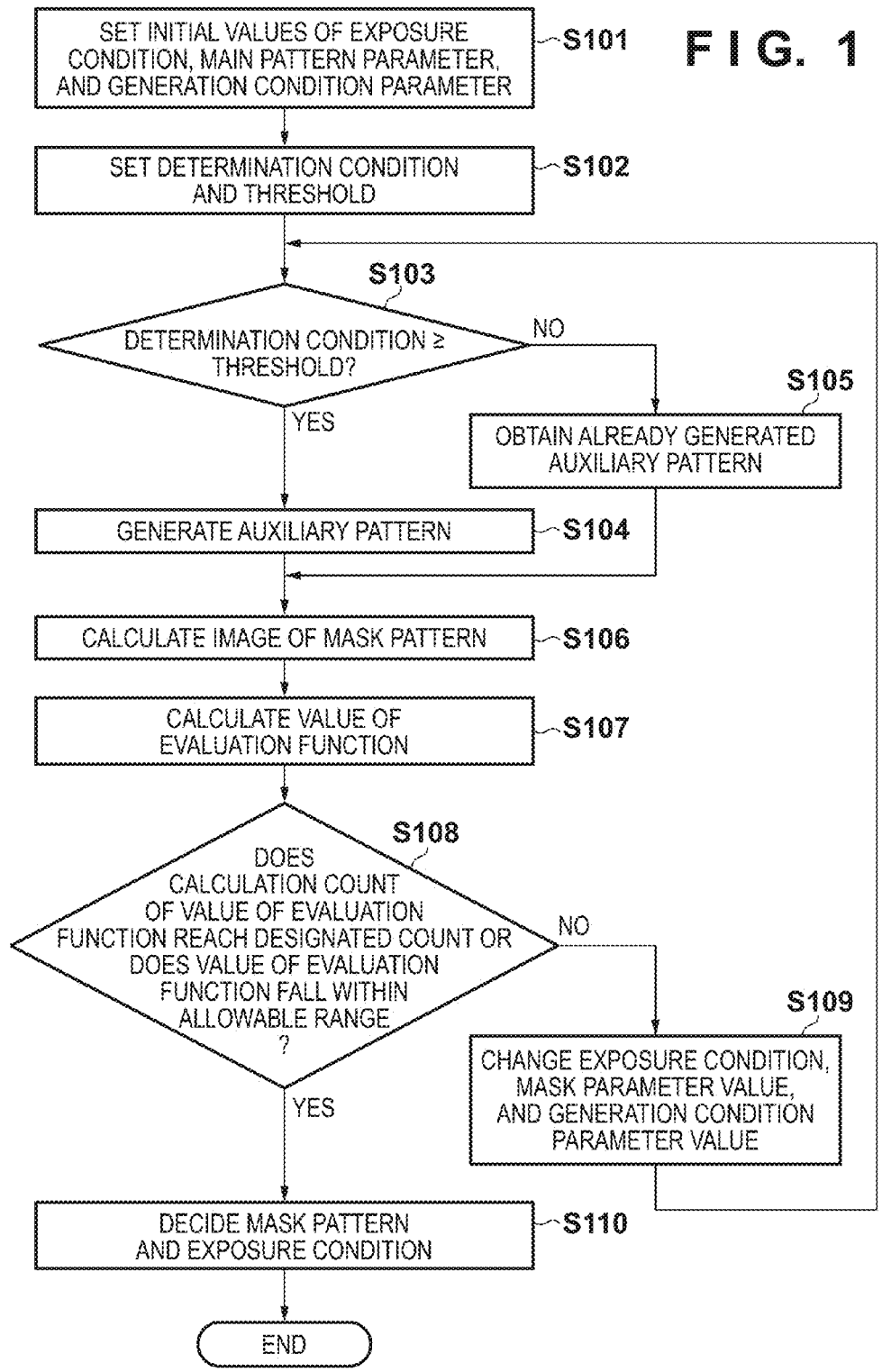
FIG. 1 is a flowchart for explaining a decision method as one aspect of the present invention.

Preferred embodiments of the present invention will be described below with reference to the accompanying drawings. Note that the same reference numerals denote the same members throughout the drawings, and a repetitive description thereof will not be given.

The present invention is applicable to determination of a mask (original) and exposure conditions used in manufacture of various devices such as semiconductor chips (an IC, LSI, and the like), display elements (a liquid crystal panel, and the like), detection elements (a magnetic head, and the like), and imaging elements (a CCD, and the like) and micromechanics. Note that "micromechanics" means a technique for producing a machine system of a micron unit having advanced functions by applying a semiconductor integrated circuit manufacturing technique to the manufacture of microstructures, and such machine system itself. The present invention is suitable for decision (optimization) of a mask pattern and exposure conditions used in an exposure apparatus which includes a projection optical system for projecting a mask pattern including a main pattern and auxiliary pattern onto a substrate. Note that the main pattern means a self resolving pattern, and an auxiliary pattern means a self non-resolving pattern which is not resolved.

The present invention calculates an image of a mask pattern to be formed on a substrate by the projection optical system while changing settings of a main pattern, generation conditions required to generate an auxiliary pattern, and exposure conditions. Then, the mask pattern and exposure conditions are decided (optimized) so that the image of the mask pattern becomes a target pattern to be formed on a substrate. Upon calculation of the image of the mask pattern after the settings of the main pattern, generation conditions, and exposure conditions are changed, whether or not to generate a new auxiliary pattern according to the generation conditions is determined, thus deciding a mask pattern and exposure conditions with high imaging performance within a short period of time.

FIG. 1 is a flowchart for explaining a decision method as one aspect of the present invention. This decision method is executed by an information processing apparatus such as a computer. A processing unit of the information processing apparatus decides (optimizes) a mask pattern and exposure conditions used in an exposure apparatus which includes a projection optical system for projecting a mask pattern including a main pattern and auxiliary pattern.

In step S101, initial values of an exposure conditions in the exposure apparatus, main pattern parameters which define a main pattern, and generation conditions (generation condition parameters) required to generate an auxiliary pattern are set. In this case, the exposure conditions are conditions settable in the exposure apparatus, and include at least one of a shape of an effective light source, a numerical aperture (NA) of the projection optical system, a tilt of a stage used to hold a substrate, vibrations of the stage used to hold a substrate, and a depth of focus. Note that the shape of the effective light source is a light intensity distribution to be formed on a pupil plane of an illumination optical system, and is defined by, for example, outer and inner sigma values, an aperture angle, and the like of the effective light source. The generation conditions are required to decide at least one of a position and shape of an auxiliary pattern. The generation conditions include, for example, at least one of an interference map peak threshold, a peak obtaining direction of a two-dimensional TCC approximate aerial image, a proximity pattern distance, and a defocus. Note that the interference map peak threshold is a threshold of intensities when a position of an auxiliary pattern is decided based on intensities at respective positions of a mask pattern image (two-dimensional TCC approximate aerial image) formed on a substrate. The peak obtaining direction is a direction for differentiating an mask pattern image formed on a substrate. The proximity pattern distance is a distance required between an auxiliary pattern and neighboring patterns (main pattern and another auxiliary pattern) upon generation (insertion) of the auxiliary pattern. The defocus is that required upon generation of the auxiliary pattern.

In step S102, a determination condition as to whether or not to generate a new auxiliary pattern according to the generation condition and a threshold of the determination condition upon calculation of a mask pattern image are set. As the determination condition, a condition related to a change of the position or shape of an auxiliary pattern is set. The position and shape of the auxiliary pattern are changed according to, for example, the shape of the effective light source. Therefore, a change amount or the like of the shape of the effective light source can be set as the determination condition. Also, as the threshold of the determination condition, a very small change amount of the shape of the effective light source, that is, a change amount which does not cause the position and shape of the auxiliary pattern to change even when the effective light source is changed may be set.

In step S103, the determination condition (values) set in step S102 before and after the exposure conditions, mask pattern, and generation conditions are changed is calculated, and whether or not the determination condition is equal to or larger than the threshold is determined. If the determination condition is equal to or larger than the threshold, the process advances to step S104; otherwise, the process advances to step S105. However, when all of the set exposure conditions, main pattern parameters, and generation condition parameters assume initial values, that is, when the exposure conditions, mask pattern, and generation conditions are not changed, since the determination condition cannot be calculated, the process advances to step S104. Note that a predetermined range may be used as a reference in place of the threshold in step S103, and whether or not the determination condition falls within the range may be determined.

In step S104, an auxiliary pattern is generated according to the set generation condition parameters. More specifically, when the exposure conditions, mask pattern, and generation conditions have not been changed yet, an auxiliary pattern is generated according to the initial values of the generation condition parameters set in step S101. On the other hand, when the exposure conditions, mask pattern, and generation conditions have been changed even once, an auxiliary pattern is generated according to generation condition parameter values finally changed (set) in step S109.

In step S105, an already generated auxiliary pattern (that is, an auxiliary pattern generated in step S104) is obtained without generating any auxiliary pattern according to the set generation condition parameters.

In step S106, an image of the mask pattern to be formed on a substrate by the projection optical system is calculated using the set mask pattern and exposure conditions. In this case, the mask pattern includes a main pattern defined by the set main pattern parameter values, and the auxiliary pattern generated in step S104 or that obtained in step S105. Note that the positions and shapes of the main pattern and auxiliary pattern included in the mask pattern may be finely adjusted (corrected) upon calculation of the image of the mask pattern in step S106.

In step S107, an evaluation function required to temporarily decide the mask pattern, that is, a value of the evaluation function indicating an index about right/wrong of the image of the mask pattern is calculated. More specifically, the value of the evaluation function is calculated by calculating values of evaluation indices (line width, shift, and the like) at respective evaluation positions of the image of the mask pattern calculated in step S106. As the evaluation function, for example, differences of the line width and position shift of the main pattern and the peak intensity of the auxiliary pattern from their target values may be used.

It is determined in step S108 whether or not a calculation count of the value of the evaluation function (that is, a repetition count of step S107) reaches a designated count or whether or not the value of the evaluation function falls within an allowable range. If the calculation count of the value of the evaluation function does not reach the designated count or if the value of the evaluation function falls outside the allowable range, the process advances to step S109. On the other hand, if the calculation count of the value of the evaluation function reaches the designated count or if the value of the evaluation function falls within the allowable range, the process advances to step S110.

In step S109, the exposure conditions, parameter values of the mask pattern (main pattern parameters and auxiliary pattern parameters), and generation condition parameter values are changed based on the value of the evaluation function calculated in step S107 using, for example, a Nelder-Mead method. In other words, in step S109, the exposure conditions, main pattern parameter values, auxiliary pattern parameter values, and generation condition parameter values are set again. The Nelder-Mead method is also called a downhill simplex method, and is described in J. A. Nelder and R. Mead, Computer Journal, vol. 7, p. 308, 1965.

In step S110, the mask pattern and exposure conditions are decided. More specifically, the mask pattern including the main pattern and auxiliary pattern which respectively correspond to the main pattern parameter values and auxiliary pattern parameter values which are finally set (that is, which are changed in step S109) is decided as that used in the exposure apparatus. In this case, the auxiliary pattern is generated according to the auxiliary pattern generation conditions (generation condition parameters) which is finally changed (set) in step S109. Also, the exposure conditions which are finally set (that is, which are changed in step S109) are decided as those in the exposure apparatus.

In this embodiment, when the image of the mask pattern is calculated after the main pattern, generation conditions, and exposure conditions are changed, whether or not to generate a new auxiliary pattern according to the generation conditions is determined. Then, when the auxiliary pattern is to be generated, a new auxiliary pattern is generated according to the generation conditions after the setting change, and the image of the mask pattern is calculated using the mask pattern including that auxiliary pattern and the main pattern after the setting change, and the exposure conditions after the setting change. On the other hand, when the auxiliary pattern is not to be generated, the image of the mask pattern is calculated using the mask pattern including the auxiliary pattern which has already been generated according to the generation conditions before the setting change and the main pattern after the setting change, and the exposure conditions after the setting change. In this manner, when the determination condition associated with changes of the position and shape of the auxiliary pattern is converged, generation of a new auxiliary pattern is skipped, and the already generated auxiliary pattern is used, thus deciding (optimizing) the mask pattern and exposure conditions within a short period of time.

The mask pattern and exposure conditions decided according to the decision method of this embodiment (that is, those optimized according to this embodiment) will be described in detail below.

Figure 2:
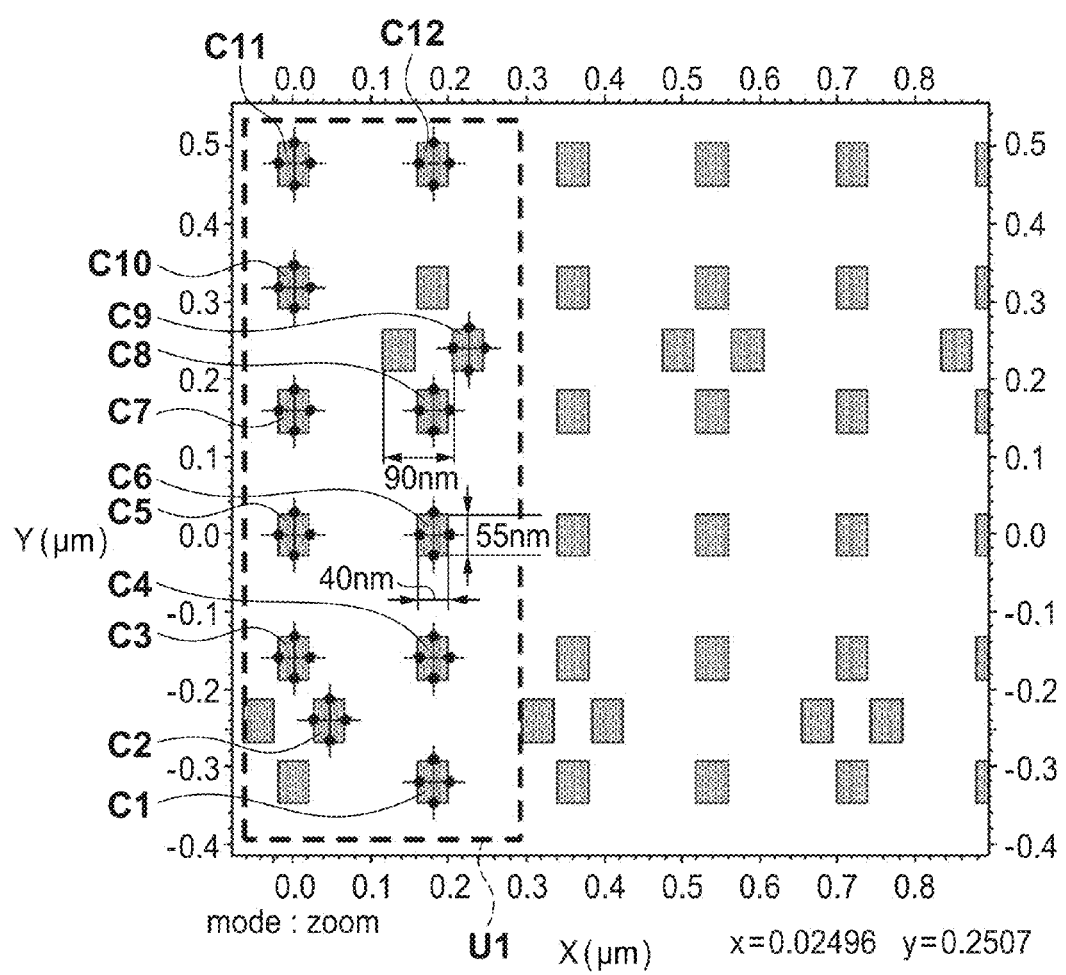
FIG. 2 is a view showing an example of a mask pattern.

A mask pattern corresponding to a target pattern formed on a substrate was a pattern corresponding to a contact process of a 20-nm node, as shown in FIG. 2. The mask pattern shown in FIG. 2 is classified into patterns C1 to C12 in consideration of symmetry, and is a repetitive pattern of a pattern unit U1 including the patterns C1 to C12. Parameters of each of the patterns C1 to C12 include a hole size in an X direction, that in a Y direction, a central position shift in the X direction, and that in the Y direction. Therefore, the mask pattern shown in FIG. 2 is defined by 48 parameters. The hole sizes of the patterns C1 to C12 on the image plane of the projection optical system were 40 nm in the X direction and 55 nm in the Y direction. Also, an image plane-converted mask size fell within a range from 30 to 100 nm in both the X and Y directions, and a position shift was ±5 nm in both the X and Y directions.

The interference map peak threshold, proximity pattern distance, and defocus as the generation conditions required to generate the auxiliary pattern were fixed as follows. An upper limit value of the interference map peak threshold was 0.5 times of a maximum value of a Laplacian value of a two-dimensional TCC approximate aerial image, and a lower limit value was 0.3 times of a minimum value (negative value) of the Laplacian value of the two-dimensional TCC approximate aerial image. The proximity pattern distance was 43 nm. The defocus was 30 nm.

Figure 3:
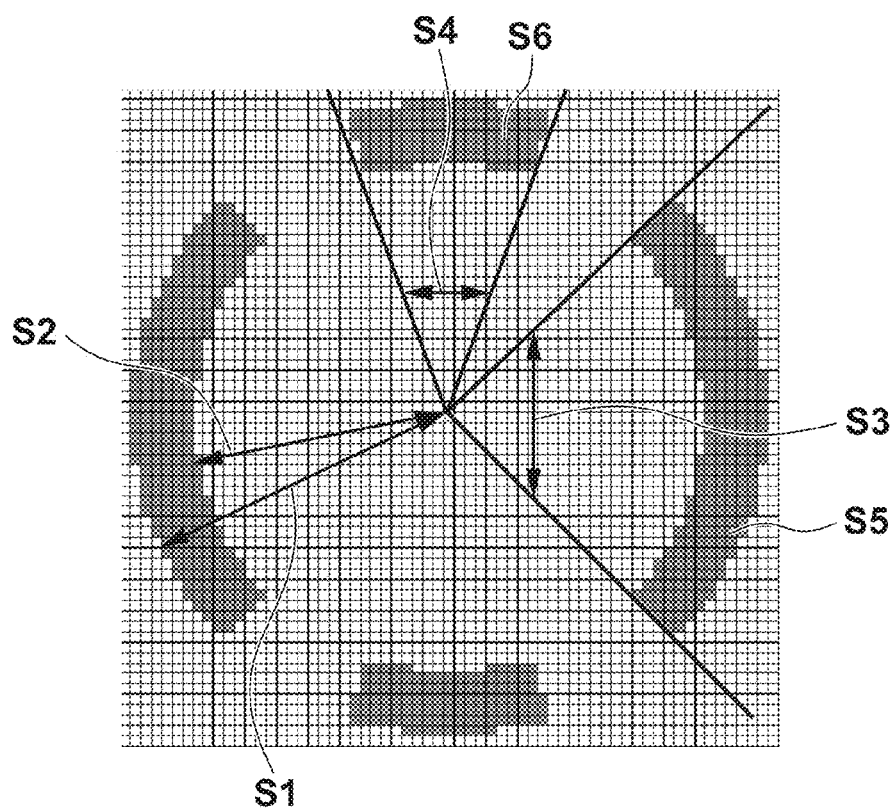
FIG. 3 is a view showing an effective light source as one of exposure conditions.

FIG. 3 shows a parametric effective light source as one of exposure conditions. As shown in FIG. 3, this effective light is a quadruple illumination, and is defined by parameters S1 to S6, as shown in FIG. 3. A parameter S1 is an outer sigma value (change range: $0.70 \leq S1 \leq 0.98$), and indicates an outer diameter of an annular effective light source. A parameter S2 is an inner sigma value, and indicates an inner diameter of the annular effective light source. However, in this embodiment, in place of the inner sigma value of the parameter S2, an annular ratio expressed by S2/S1 (change range: $0.50 \leq S2/S1 \leq 0.80$) was used. A parameter S3 is a double-pole aperture angle (change range: $20° \leq S3 \leq 90°$ in the X direction. A parameter S4 is a double-pole aperture angle (change range: $20° \leq S4 \leq 90°$) in the Y direction. A parameter S5 is a double-pole intensity (fixed: 1) in the X direction. A parameter S6 is a double-pole intensity (change range: $0 \leq S6 \leq 1$) in the Y direction.

Figure 4:
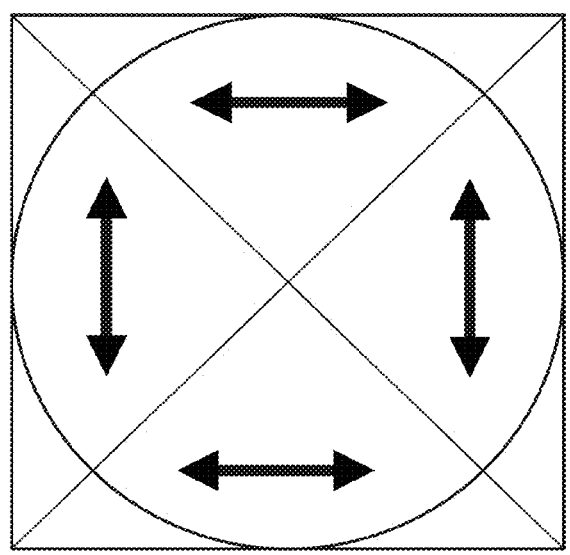
FIG. 4 is a view showing an example of a polarization state of the effective light source.

Polarization of the effective light source was 4-divided tangential polarization, as shown in FIG. 4. As other exposure conditions, a numerical aperture (NA) of the projection optical system was 1.35, and a wavelength of exposure light was 193.368 nm.

The determination condition as to whether or not to generate an auxiliary pattern included change amounts of the sigma (σ) values of the effective light source, and thresholds were 0.05 for the change amount of the outer σ value, 0.05 for that of the annular ratio, and 5° for that of the aperture angle.

FIGS. 5A to 5D show the exposure conditions and mask pattern, which are sequentially changed (set) by the decision method of this embodiment. More specifically, the outer σ value (S1) is changed in turn to 0.80, 0.90, 0.98, and 0.98. The annular ratio (S2/S1) is changed in turn to 0.50, 0.75, 0.80, and 0.80. The double-pole aperture ratio (S3) in the X direction is changed in turn to 70°, 80°, 85°, and 90°, and the double-pole aperture angle (S4) in the Y direction is changed in turn to 50°, 30°, 22.5°, and 22.5°. The double-pole intensity (S6) in the Y direction is changed in turn to 1.0, 0.9, 0.8, and 0.8.

FIG. 5A shows (the shape of) the effective light source and mask pattern when the outer σ value is set to be 0.80, the annular ratio is set to be 0.50, the double-pole aperture angle in the X direction is set to be 70°, the double-pole aperture angle in the Y direction is set to be 50°, and the double-pole intensity in the Y direction is set to be 1.0. FIG. 5B shows (the shape of) the effective light source and mask pattern when the outer σ value is set to be 0.90, the annular ratio is set to be 0.75, the double-pole aperture angle in the X direction is set to be 80°, the double-pole aperture angle in the Y direction is set to be 30°, and the double-pole intensity in the Y direction is set to be 0.9. FIG. 5C shows (the shape of) the effective light source and mask pattern when the outer σ value is set to be 0.98, the annular ratio is set to be 0.80, the double-pole aperture angle in the X direction is set to be 85°, the double-pole aperture angle in the Y direction is set to be 22.5°, and the double-pole intensity in the Y direction is set to be 0.8. FIG. 5D shows (the shape of) the effective light source and mask pattern when the outer σ value is set to be 0.98, the annular ratio is set to be 0.80, the double-pole aperture angle in the X direction is set to be 90°, the double-pole aperture angle in the Y direction is set to be 22.5°, and the double-pole intensity in the Y direction is set to be 0.8.

Upon comparison of cases in which parameter values which define the effective light source are largely different, that is, upon comparison of FIGS. 5A, 5B, and 5C, positions (layouts) of auxiliary patterns are respectively different. On the other hand, upon comparison of cases in which parameter values which define the effective light source are close to each other, that is, upon comparison of FIGS. 5C and 5D, the positions of auxiliary patterns are roughly the same.

FIGS. 6A to 6D show evaluation results of the depth of focus (DOF) for the effective light sources and mask patterns shown in FIGS. 5A to 5D. In FIGS. 6A to 6D, the ordinate plots an exposure margin, and the abscissa plots a depth of focus. Referring to FIGS. 6A to 6D, the depths of focus corresponding to the effective light sources and mask patterns shown in FIGS. 5A to 5D are respectively 27.3 nm, 48.4 nm, 80.3 nm, and 80.5 nm.

Figure 6A:
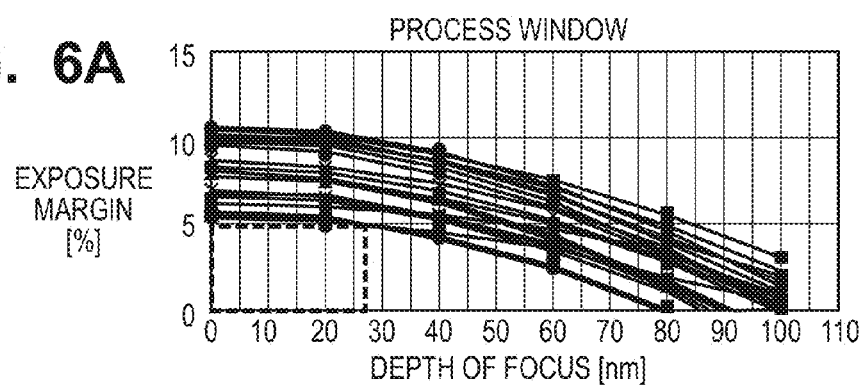
FIGS. 6A to 6D are graphs showing evaluation results of a depth of focus with respect to the effective light sources and mask patterns shown in FIGS. 5A to 5D.
Figure 6B:
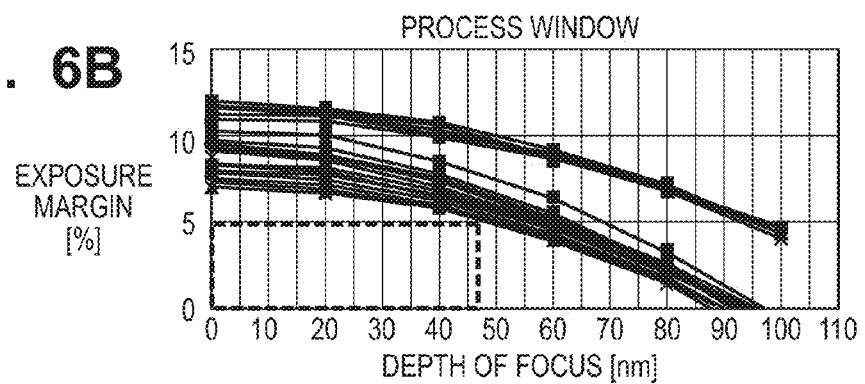
Figure 6C:
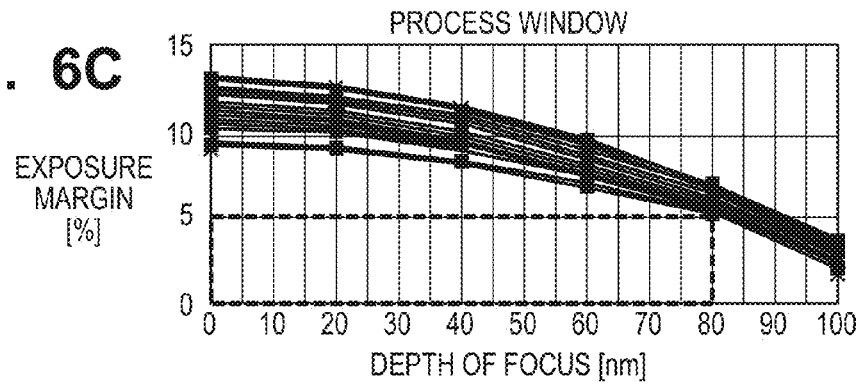
Figure 6D:
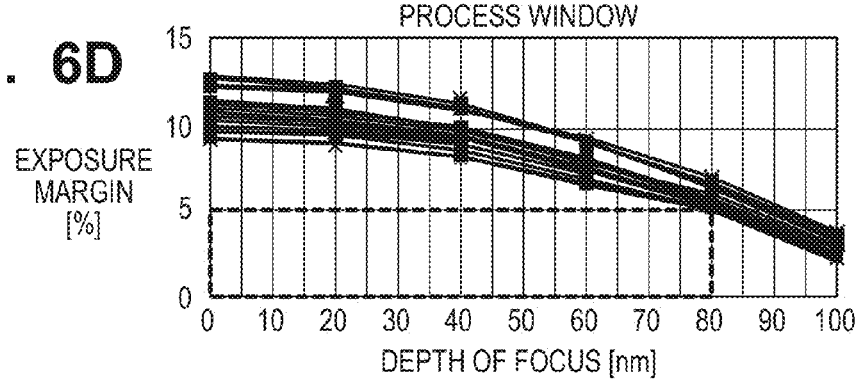

Upon comparison of cases in which parameter values which define the effective light source are largely different, that is, upon comparison of FIGS. 6A, 6B, and 6C, the depths of focus are respectively different. On the other hand, upon comparison of cases in which parameter values which define the effective light source are close to each other, that is, upon comparison of FIGS. 6C and 6D, a difference between the depths of focus is about 2 nm, and the depths of focus are nearly the same. Therefore, as can be seen from the above description, if the change amounts of the σ values of the effective light sources as the determination conditions are less than the thresholds, even when a new auxiliary pattern is not generated, the changes of the effective light source do not influence the auxiliary pattern, thus obtaining equivalent depths of focus.

Figure 7:
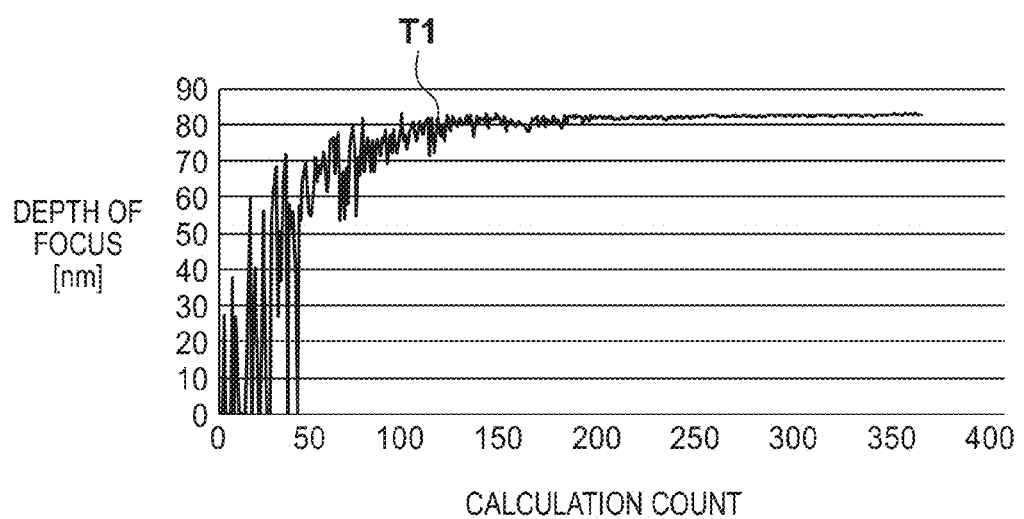
FIG. 7 is a graph showing a depth-of-focus transition in the decision method of this embodiment.

FIG. 7 is a graph showing the depth-of-focus transition in the decision method of this embodiment. In FIG. 7, the ordinate plots a depth of focus, and the abscissa plots a calculation count of the image of the mask pattern. A time period required to generate an auxiliary pattern (S104) occupies about 50% of a time period required for other processes. At time T1 at which the exposure conditions (effective light source) are converged, only ⅓ of all the processes are ended. Since the position and shape of the auxiliary pattern are nearly not changed from time T1, generation of the auxiliary pattern is omitted from time T1, thus reducing the time period required until the mask pattern and exposure conditions are decided by abut 30%.

In this manner, when the change amounts of the effective light source as the exposure conditions are small (less than the thresholds), since the already generated auxiliary pattern is used without generating a new auxiliary pattern, the mask pattern and exposure conditions which can assure excellent imaging performance can be decided within a short period of time.

Figure 8A:
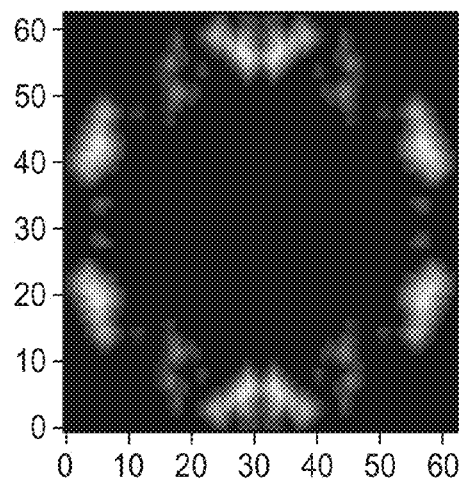
FIGS. 8A to 8C are views for explaining determination as to whether or not to generate a new auxiliary pattern.
Figure 8B:
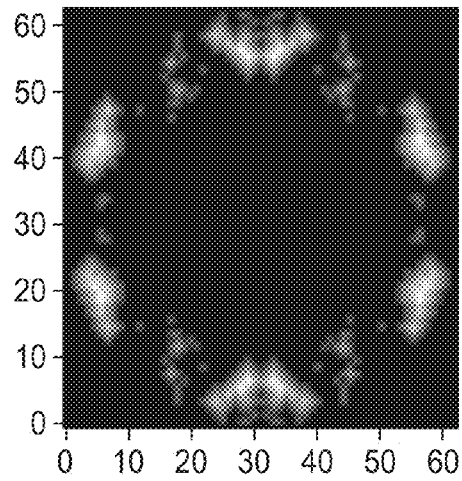
Figure 8C:
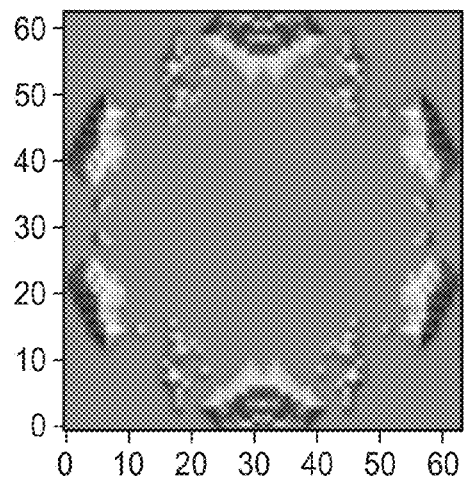

In this embodiment, whether or not to generate a new auxiliary pattern is determined based on the change amounts of the parameter values which define the effective light source. However, the present invention is not limited to this. For example, as shown in FIGS. 8A to 8C, whether or not to generate a new auxiliary pattern may be determined based on a difference (for example, an RMS value) between bitmap data which represents the shape of the effective light source before change and that which represents the shape of the effective light source after change. FIG. 8A shows the bitmap data which represents the shape of the effective light source before change, and FIG. 8B shows that which represents the shape of the effective light source after change. FIG. 8C shows a difference between the bitmap data shown in FIGS. 8A and 8B.

The determination condition as to whether or not to generate a new auxiliary pattern may use change amounts of other exposure conditions, for example, that of the NA of the projection optical system, that of a tilt of a stage which holds a substrate, that of vibrations of the stage which holds a substrate, and the like.

The determination condition as to whether or not to generate a new auxiliary pattern may use a change amount of the evaluation value of the image of the mask pattern. This evaluation value includes, for example, at least one of a line width error between the image of the mask pattern and target pattern, a normalized image log slope (NILS), an exposure margin of the image of the mask pattern, a depth of focus, and MEEF. "MEEF" is a short for "Mask Error Enhancement Factor", and indicates a magnitude of a dimension error which is generated on a pattern projected onto a substrate when the dimension error of a specific value has occurred in the pattern on the mask at the time of manufacture of the mask.

Also, the determination condition as to whether or not to generate a new auxiliary pattern may use the generation condition required to generate an auxiliary pattern, that is, an interference map peak threshold, proximity pattern distance, defocus, and the like.

Figures 9A, 9B, 9C:
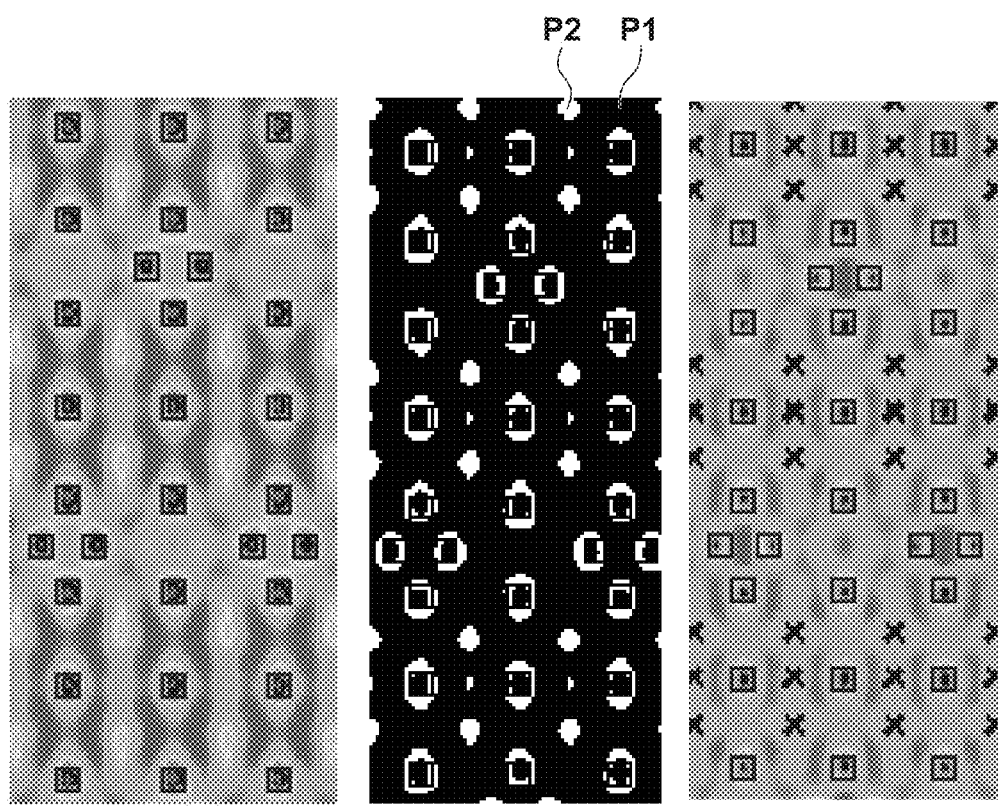
FIGS. 9A to 9C are views for explaining an interference map peak threshold.

The interference map peak threshold is a threshold (upper and lower limit values) of an intensity upon deciding a position of an auxiliary pattern from intensities at respective positions of the image (two-dimensional TCC approximate aerial image) of the mask pattern formed on a substrate, as described above. Therefore, when an auxiliary pattern is not generated at a position P1 at which the intensity does not satisfy the threshold, as shown in FIG. 9B, with respect to a two-dimensional TCC approximate aerial image shown in FIG. 9A, and an auxiliary pattern is generated at a position P2 at which the intensity satisfies the threshold, a mask pattern shown in FIG. 9C is obtained.

The proximity pattern distance is a distance required between an auxiliary pattern and neighboring patterns (main pattern and another auxiliary pattern) when the auxiliary pattern is generated (inserted), as described above. For example, a case will be examined below wherein a proximity pattern distance D1 is set (decided), as shown in FIG. 10B, with respect to an insertion candidate position P3 of an auxiliary pattern shown in FIG. 10A. In this case, since an auxiliary pattern AP1 located within the proximity pattern distance D1 is removed, and an auxiliary pattern AP2 located outside the proximity pattern distance D1 is left, a mask pattern shown in FIG. 10C is obtained.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2012-087937 filed on Apr. 6, 2012, which is hereby incorporated by reference herein in its entirety.

What is claimed is:

1. A determination method which determines a mask pattern used in an exposure apparatus comprising a projection optical system that projects a mask pattern including a main pattern and an auxiliary pattern onto a substrate, and an exposure condition in the exposure apparatus, the method comprising the following step executed by a processor:
    a step of calculating an image of a mask pattern formed on the substrate by the projection optical system while changing settings of the mask pattern and the exposure condition, and determining the mask pattern and the exposure condition based on the image of the mask pattern,
    wherein the step comprises:
        determining whether or not to generate a new auxiliary pattern after the settings are changed;
        generating the new auxiliary pattern according to a generation condition of the auxiliary pattern when it is determined that the new auxiliary pattern is generated, and calculating the image of the mask pattern using the mask pattern including the generated auxiliary pattern and the main pattern after the settings are changed, and the exposure condition after the settings are changed; and
        calculating, when it is determined that the new auxiliary pattern is not generated, the image of the mask pattern using a mask pattern including an auxiliary pattern generated before the settings are changed and the main pattern after the settings are changed, and the exposure condition after the settings are changed.

2. The method according to claim 1, wherein in the determining whether or not to generate a new auxiliary pattern, when a change amount of at least one of the exposure condition, an evaluation value of the image of the mask pattern, and the generation condition is not less than a threshold, it is determined that the auxiliary pattern is generated, and when the change amount is less than the threshold, it is determined that the auxiliary pattern is not generated.

3. The method according to claim 2, wherein the exposure condition includes at least one of a shape of an effective light source used to illuminate the mask pattern, a numerical aperture of the projection optical system, a tilt of a stage used to hold the substrate, and a vibration of the stage used to hold the substrate,
    the evaluation value includes at least one of a line width error between the image of the mask pattern and the target pattern, a normalized image log slope of the image of the mask pattern, an exposure margin of the image of the mask pattern, and a depth of focus of the image of the mask pattern, and
    the generation condition includes a threshold of an intensity upon deciding a position of the auxiliary pattern from intensities at respective positions on the image of the mask pattern, a direction to differentiate the image of the mask pattern, and a distance required between the auxiliary pattern and neighboring patterns upon generation of the auxiliary pattern.

4. The method according to claim 3, wherein the shape of the effective light source is defined by at least one of an outer sigma value of the effective light source, an inner sigma value of the effective light source, and an aperture angle of the effective light source.

5. The method according to claim 1, wherein the exposure condition includes a shape of an effective light source used to illuminate the mask pattern, and
    in the determining whether or not to generate the auxiliary pattern, whether or not to generate the auxiliary pattern is determined based on a difference between bitmap data which represents the shape of the effective light source before the settings are changed, and bitmap data which represents the shape of the effective light source after the settings are changed.

6. A non-transitory storage medium storing a program for controlling a computer to execute a determination method which determines a mask pattern used in an exposure apparatus comprising a projection optical system that projects a mask pattern including a main pattern and an auxiliary pattern onto a substrate, and an exposure condition in the exposure apparatus,
    the program controlling the computer to execute:
        a step of calculating an image of a mask pattern formed on the substrate by the projection optical system while changing settings of the mask pattern and the exposure condition, and determining the mask pattern and the exposure condition based on the image of the mask pattern,
    wherein the step comprises:
        determining whether or not to generate a new auxiliary pattern after the settings are changed;
        generating the new auxiliary pattern according to a generation condition of the auxiliary pattern after the settings are changed when it is determined that the new auxiliary pattern is generated, and calculating the image of the mask pattern using the mask pattern including the generated auxiliary pattern and the main pattern after the settings are changed, and the exposure condition after the settings are changed; and calculating, when it is determined that the new auxiliary pattern is not generated, the image of the mask pattern using a mask pattern including an auxiliary pattern generated before the settings are changed and the main pattern after the settings are changed, and the exposure condition after the settings are changed.

7. An information processing apparatus which determines a mask pattern used in an exposure apparatus comprising a projection optical system that projects a mask pattern including a main pattern and an auxiliary pattern onto a substrate, and an exposure condition in the exposure apparatus, the apparatus comprising:

a processing unit configured to calculate an image of a mask pattern formed on the substrate by the projection optical system while changing settings of the mask pattern and the exposure condition, and to determine the mask pattern and the exposure condition based on the image of the mask pattern, wherein the processing unit determines whether or not to generate a new auxiliary pattern after the settings are changed, when the processing unit determines that the new auxiliary pattern is generated, the processing unit generates the new auxiliary pattern according to a generation condition of the auxiliary pattern after the settings are changed, and calculates the image of the mask pattern using the mask pattern including the generated auxiliary pattern and the main pattern after the settings are changed, and the exposure condition after the settings are changed, and when the processing unit determines that the new auxiliary pattern is not generated, the processing unit calculates the image of the mask pattern using a mask pattern including an auxiliary pattern generated before the settings are changed and the main pattern after the settings are changed, and the exposure condition after the settings are changed.

* * * * *